US012796562B2

(12) United States Patent
Wang

(10) Patent No.: US 12,796,562 B2
(45) Date of Patent: Nov. 10, 2026

(54) CHIP PACKAGE DEVICES AND MEMORY SYSTEMS

(71) Applicant: Yangtze Memory Technologies Co., Ltd., Wuhan (CN)

(72) Inventor: Xuhui Wang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 499 days.

(21) Appl. No.: 18/461,316

(22) Filed: Sep. 5, 2023

(65) Prior Publication Data

US 2024/0363588 A1 Oct. 31, 2024

(30) Foreign Application Priority Data

Apr. 28, 2023 (CN) ......................... 202310503614.0

(51) Int. Cl.

| | |
|---|---|
| ***H10W 74/10*** | (2026.01) |
| ***H10B 80/00*** | (2023.01) |
| ***H10W 90/00*** | (2026.01) |
| *H10W 70/68* | (2026.01) |
| *H10W 72/00* | (2026.01) |

(52) U.S. Cl.

CPC ............ *H10W 90/00* (2026.01); *H10B 80/00* (2023.02); *H10W 74/121* (2026.01); *H10W 70/681* (2026.01); *H10W 72/823* (2026.01); *H10W 72/865* (2026.01); *H10W 72/884* (2026.01); *H10W 90/732* (2026.01); *H10W 90/734* (2026.01); *H10W 90/754* (2026.01)

(58) Field of Classification Search

CPC . H01L 25/0657; H01L 23/3135; H01L 24/32; H01L 24/48; H01L 24/73; H01L 2224/32145; H01L 2224/32225; H01L 2224/48225; H01L 2224/73215; H01L 2224/73265; H01L 2225/0651; H01L 2225/06548; H01L 2924/15151; H01L 24/49; H01L 24/92; H01L 23/3128; H01L 23/481; H01L 23/5283; H10B 80/00

See application file for complete search history.

(56) References Cited

U.S. PATENT DOCUMENTS

2019/0157209 A1* 5/2019 Wang .................. H01L 23/5389

* cited by examiner

*Primary Examiner* — Elias Ullah

(74) *Attorney, Agent, or Firm* — Hanley, Flight & Zimmerman, LLC

(57) ABSTRACT

The present application provides a chip package device and a memory system. The chip package device includes: a circuit substrate having a first surface and a second surface disposed oppositely, wherein the circuit substrate includes an opening that penetrates through the circuit substrate in a direction from the first substrate towards the second surface; a first chip; a second chip, wherein the second chip is fixed on the first surface of the circuit substrate, and the first chip is fixed on a surface of the second chip far away from the circuit substrate; a first conductive assembly connecting the first chip and the circuit substrate; and a second conductive assembly, wherein a part of the second conductive assembly penetrates through the opening, and the second conductive assembly connects the second chip and the circuit substrate.

16 Claims, 5 Drawing Sheets

100

CHIP PACKAGE DEVICES AND MEMORY SYSTEMS

CROSS-REFERENCE TO RELATED APPLICATION

This application claims priority to and the benefit of Chinese Patent Application 202310503614.0, filed on Apr. 28, 2023, which is hereby incorporated by reference in its entirety.

TECHNICAL FIELD

The present disclosure relates to semiconductor packages, and particularly to a chip package devices and memory systems.

BACKGROUND

Currently, with the increasing growth of demands for miniaturization, higher speed, larger bandwidth and lower power consumption and delay of chips, the demands for storage capacity of the chips and more inventive package technologies are also increasing.

Therefore, how to improve the performance of a chip package device is a technical problem to be addressed.

REFERENCE NUMERALS

Figure 1:
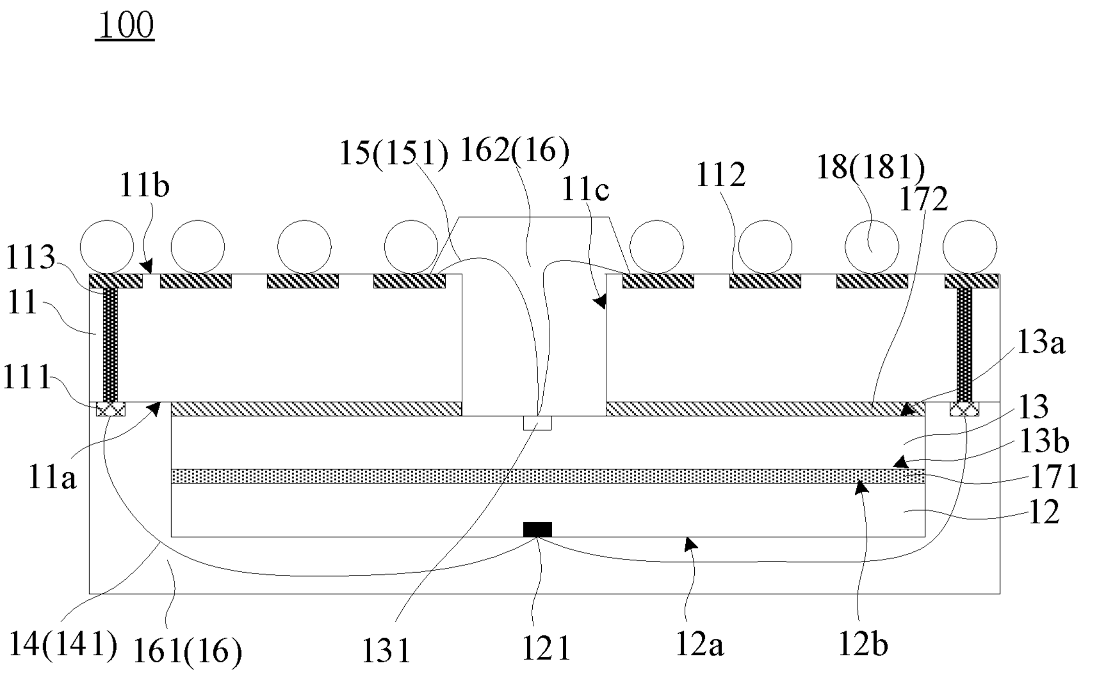
FIG. 1 is a schematic sectional view of a chip package device of some examples of the present application.

100, Chip package device; 200, Memory; 300, Controller; 400, Memory system; 500, Electronic apparatus; 600, Host;

11, Circuit substrate; 11*a*, First surface; 11*b*, Second surface; 11*c*, Opening; 111, Pin; 112, Third pad; 113, Through-hole;

12, First chip; 12*a*, First active surface; 12*b*, First back surface; 121: First pad;

13, Second chip; 13*a*, Second active surface; 13*b*, Second back surface; 131, Second pad;

14, First conductive assembly; 141, First wire; 1411, First wire segment; 1412, Second wire segment; 142, Conductive bridging block; 143, Carrier;

15, Second conductive assembly; 151, Second wire;

16, Package layer; 161, First package layer; 162: Second package layer;

171, First adhesion layer; 172, Second adhesion layer;

18, Ball grid array; 181, Solder ball.

DETAILED DESCRIPTION

The technical solutions in examples of the present application will be described below clearly and completely in conjunction with the drawings in the examples of the present application. the examples described are only part of, but not all of, the examples of the present application. All other examples obtained by those of ordinary skill in the art based on the examples in the present application without creative work shall fall in the scope of protection of the present application.

In some related arts, due to the limitations of circuit designs on the surfaces of chips, it is difficult to achieve stacking and packaging of two or more chips, and only the packaging of a single chip can be achieved. However, the chip package device obtained from the single chip after packaging has limited performance and storage capacity, failing to meet the actual application requirements.

In view of this, referring to FIGS. 1 to 8, examples of the present application provide a chip package device 100 which comprises a circuit substrate 11, a first chip 12, a second chip 13, a first conductive assembly 14 and a second conductive assembly 15. The circuit substrate 11 has a first surface 11*a* and a second surface 11*b* disposed oppositely. The circuit substrate 11 comprises an opening 11*c* that penetrates through the circuit substrate 11 in a direction from the first surface 11*a* towards the second surface 11*b*. The second chip 13 is fixed on the first surface 11*a* of the circuit substrate 11. The first chip 12 is fixed on a surface of the second chip 13 far away from the circuit substrate 11. The first conductive assembly 14 connects the first chip 12 and the circuit substrate 11. A part of the second conductive assembly 15 penetrates through the opening 11*c*, and the second conductive assembly 15 connects the second chip 13 and the circuit substrate 11.

Through the above design, the chip package device 100 comprises the second chip 13 and first chip 12 stacked together, and both the second chip 13 and the first chip 12 are connected with the circuit substrate 11, thus achieving the packaging of two chips, which improves the performance of the chip package device 100 and lowers the cost of manufacturing the chip package device 100.

The above solution is described in detail below in conjunction with examples.

Figure 2:
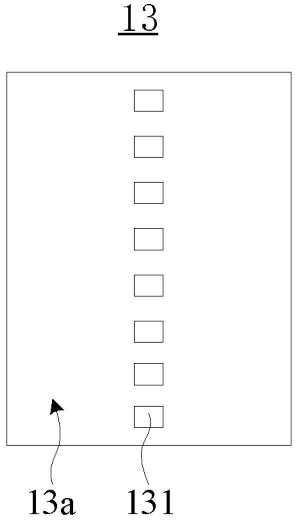
FIG. 2 is a schematic plan view of a second active surface of a second chip as shown in FIG. 1.
Figure 3:
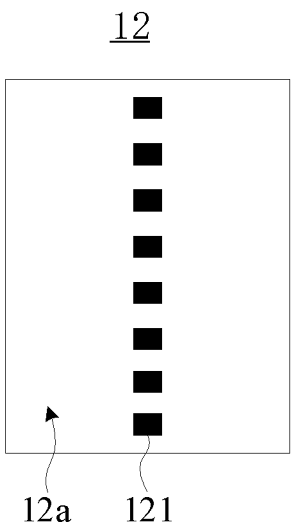
FIG. 3 is a schematic plan view of a first active surface of a first chip as shown in FIG. 1.

Referring to FIGS. 1, 2 and 3, FIG. 1 is a schematic sectional view of a chip package device of some examples of the present application, FIG. 2 is a schematic plan view of a second active surface of a second chip as shown in FIG. 1, and FIG. 3 is a schematic plan view of a first active surface of a first chip as shown in FIG. 1.

Referring to FIG. 1, the chip package device 100 comprises the circuit substrate 11, the first chip 12, the second chip 13, the first conductive assembly 14, the second conductive assembly 15, and a package layer 16.

While the circuit substrate 11 serves as a carrier of the first chip 12 and the second chip 13, the circuit substrate 11 may also comprise a circuit (not illustrated) for transmitting signals, so as to connect the first chip 12 and the second chip 13 with an external circuit. The circuit substrate 11 has the first surface 11*a* and the second surface 11*b* disposed oppositely.

In an example, the circuit substrate 11 includes, but is not limited to, a printed circuit board (PCB).

In an example, the thickness of the circuit substrate 11 is greater than or equal to 50 micrometers and less than or equal to 200 micrometers.

In some examples, the circuit substrate 11 comprises a plurality of third pads 112 located on the second surface 11*b*, wherein the plurality of third pads 112 are arranged in a two-dimensional array.

In an example, the material of the third pads 112 includes a metal, including, but not limited to, at least one of gold, copper, aluminum, silver and tungsten.

In some examples, the chip package device 100 further comprises a ball grid array 18 that comprises a plurality of solder balls 181 located on the plurality of third pads 112, such that the plurality of solder balls 181 of the ball grid array 18 are connected with the circuit substrate 11, thus making the plurality of solder balls 181 be connected with the first chip 12 and the second chip 13 packaged on the circuit substrate 11. Moreover, the external circuit is connected with the plurality of solder balls 181 to achieve connection between the external circuit and the first chip 12 as well as the second chip 13.

In an example, the material of the solder balls 181 includes, but is not limited to, tin, gold, silver, copper, aluminum, tungsten, etc.

In an example, the plurality of solder balls 181 are formed on the plurality of third pads 112 through a process such as printing, etc.

In some examples, the circuit substrate 11 comprises the opening 11*c* that penetrates through the circuit substrate 11 in a direction from the first surface 11*a* towards the second surface 11*b*, and exposes part of the second chip 13, so as to achieve connection of the second chip 13 with the third pads 112 on the second surface 11*b* of the circuit substrate 11.

In some examples, in the direction from the first surface 11*a* towards the second surface 11*b*, the shape of the cross-section of the opening 11*c* is one of a rectangle, a trapezoid or an inverted trapezoid. In an example, in the direction from the first surface 11*a* towards the second surface 11*b*, the shape of the cross-section of the opening 11*c* is a rectangle.

In some examples, the circuit substrate 11 further comprises through-holes 113 that penetrate through the circuit substrate 11 in the direction from the first surface 11*a* towards the second surface 11*b*. The through-holes 113 and the opening 11*c* are disposed as being spaced apart, and the through-holes 113 are connected with the third pads 112.

In an example, the material of the through-holes 113 includes a metal, including, but not limited to, at least one of gold, copper, aluminum, silver and tungsten.

In some examples, the circuit substrate 11 further comprises pins 111 that are located on the first surface 11*a* of the circuit substrate 11 and disposed as being spaced apart from the second chip 13. The pins 111 are connected with the through-holes 113, thus making the pins 111 be connected with the solder balls 181.

In some examples, the pins 111 are disposed along edges of the first surface 11*a* of the circuit substrate 11, so as to provide more space for fixing the second chip 13 on the first surface 11*a* of the circuit substrate 11.

In an example, the pins 111 are disposed along two opposite edges of the first surface 11*a* of the circuit substrate 11.

In an example, the material of the pins 111 includes a metal, including, but not limited to, at least one of gold, copper, aluminum, silver and tungsten.

In some examples, the area of the first chip 12 is smaller than or equal to the area of the second chip 13. In an example, the area of the first chip 12 is equal to the area of the second chip 13.

In some examples, the first chip 12 and the second chip 13 are respectively selected from one of a memory chip, a controller chip and a radio frequency chip. The memory chip includes, but is not limited to, a volatile memory chip and a non-volatile memory chip. The non-volatile memory chip includes, but is not limited to, a structure such as a NAND FLASH, a NOR FLASH, a magnetic random access memory (MRAM), a phase change memory (PCM), a resistive random access memory (RRAM) and the like; and the volatile memory chip includes, but is not limited to, a dynamic random access memory (DRAM), a static random access memory (SRAM) and the like.

In some examples, the functions of the first chip 12 and the second chip 13 are the same. For example, both the first chip 12 and the second chip 13 are memory chips to increase the storage capacity of the chip package device 100, thereby improving the performance of the chip package device 100.

In some other examples, the functions of the first chip 12 and the second chip 13 are different. For example, the first chip 12 is a controller chip, and the second chip 13 is a memory chip, so as to diversify the functions of the chip package device 100.

In an example, both the first chip 12 and the second chip 13 are double data rate dynamic random access memories (DDR-DRAMs), but the present application is not limited thereto.

Referring to both FIG. 1 and FIG. 2, the second chip 13 has a second active surface 13*a* and a second back surface 13*b* disposed oppositely, wherein the second active surface 13*a* of the second chip 13 is fixed on the first surface 11*a* of the circuit substrate 11.

The second chip 13 comprises a plurality of second pads 131, and an internal circuit of the second chip 13 is connected with the external circuit through the plurality of second pads 131. The plurality of second pads 131 are located on the second active surface 13*a* and located between two opposite edges of the second chip 13, and the plurality of second pads 131 are exposed in the opening 11*c*.

In an example, the plurality of second pads 131 are disposed in a row, and located in a middle position between the two opposite edges of the second chip 13, but the present application is not limited thereto.

In an example, the material of the second pads 131 includes a metal, including, but not limited to, at least one of gold, copper, aluminum, silver and tungsten.

In some examples, no pad through which the second chip 13 is connected with the external circuit is disposed between the two opposite edges of the second back surface 13*b* of the second chip 13, so that the first chip 12 is stacked on the second back surface 13*b* of the second chip 13, thereby achieving stacking of the two chips.

In an example, no pad through which the second chip 13 is connected with the external circuit is disposed in a middle position between the two opposite edges of the second back surface 13*b* of the second chip 13, but the present application is not limited thereto.

In some other examples, the pads through which the second chip 13 is connected with the external circuit may be disposed at the edges of the second back surface 13*b* of the second chip 13.

Referring to FIG. 1, a part of the second conductive assembly 15 penetrates through the opening 11*c*, and the second conductive assembly 15 connects the second chip 13 and the circuit substrate 11 to achieve the connection between the second chip 13 and the circuit substrate 11. The second chip 13 is connected with the external circuit through the circuit substrate 11 so as to achieve the connection between the second chip 13 and the external circuit.

In some examples, the second conductive assembly 15 comprises a plurality of second wires 151 each penetrating through the opening 11*c*, and two opposite ends of each of the second wires 151 are fixed on the second surface 11*b* of the circuit substrate 11 and the second active surface 13*a* exposed by the opening 11*c* respectively.

In an example, the two opposite ends of each of the second wires 151 are fixed on the second pad 131 of the second active surface 13*a* and the third pad 112 of the second surface 11*b* respectively.

In an example, one end of each of the plurality of second wires 151 is connected with each of the plurality of second pads 131; after penetrating through the opening 11*c*, the plurality of second wires 151 extend to two opposite sides of the opening 11*c*; and the other ends of the plurality of second wires 151 are connected with the plurality of third pads 112 on the two opposite sides of the opening 11*c* respectively.

In an example, one end of each of the second wires 151 is connected with the second pad 131 through soldering, and the other end of each of the second wires 151 is connected with the third pad 112 through soldering.

In an example, the material of the second wires 151 includes a metal, including, but not limited to, at least one of gold, copper, aluminum, silver and tungsten.

Referring to both FIG. 1 and FIG. 3, the first chip 12 is fixed on the surface of the second chip 13 far away from the circuit substrate 11, so as to achieve the stacking of the first chip 12 and the second chip 13, which increases the number of chips in the chip package device 100 and further improves the performance of the chip package device 100.

The first chip 12 has a first active surface 12*a* and a first back surface 12*b* disposed oppositely. The first back surface 12*b* of the first chip 12 is fixed on the second chip 13, a plurality of first pads 121 are disposed on the first active surface 12*a*, and the first chip 12 is connected with the external circuit through the plurality of first pads 121.

Since the first back surface 12*b* of the first chip 12 and the second back surface 13*b* of the second chip 13 face each other, and the first active surface 12*a* of the first chip 12 and the second active surface 13*a* of the second chip 13 face away from each other, the positions designed for the plurality of first pads 121 of the first chip 12 and the plurality of second pads 131 of the second chip 13 do not hinder the stacking of the first chip 12 and the second chip 13. Moreover, the first active surface 12*a* of the first chip 12 and the second active surface 13*a* of the second chip 13 face away from each other, which is also favorable to achieve the connection between the first active surface 12*a* of the first chip 12 and the circuit substrate 11.

In some examples, no pad through which the first chip 12 is connected with the external circuit is disposed on the first back surface 12*b* of the first chip 12, such that the first back surface 12*b* of the first chip 12 is fixed on the second chip 13.

In some examples, as shown in FIGS. 1 and 3, the plurality of first pads 121 are located between two opposite edges of the first active surface 12*a*.

In an example, the plurality of first pads 121 are disposed in a row, and located in a middle position between the two opposite edges of the first active surface 12*a*, but the present application is not limited thereto.

Figure 4:
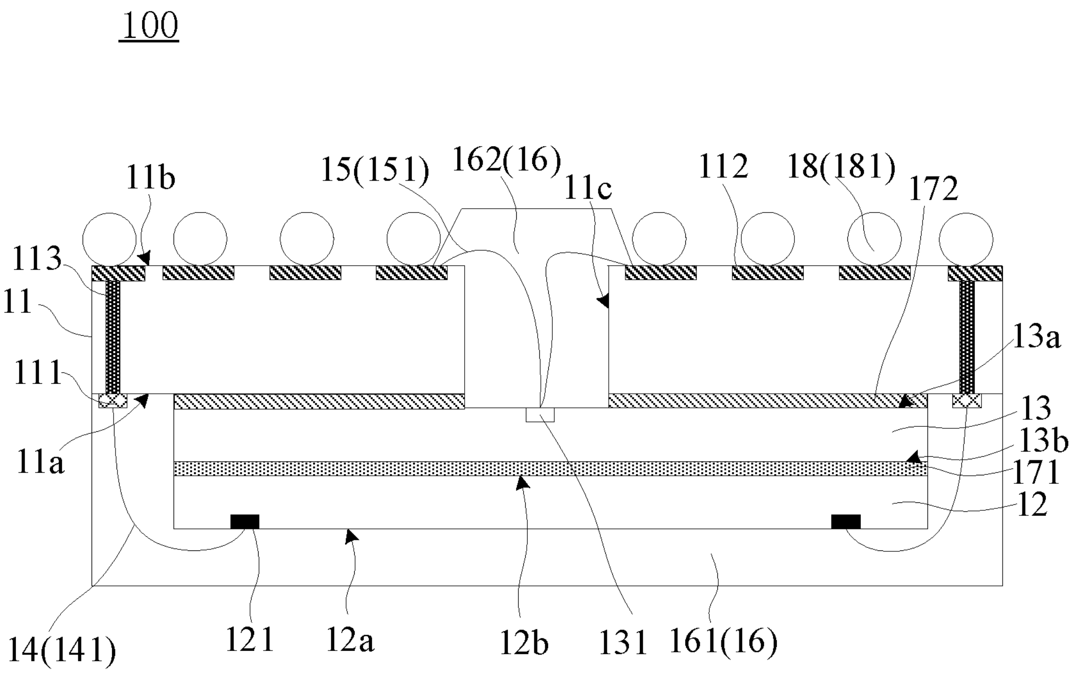
FIG. 4 is a schematic sectional view of a chip package device of some other examples of the present application.
Figure 5:
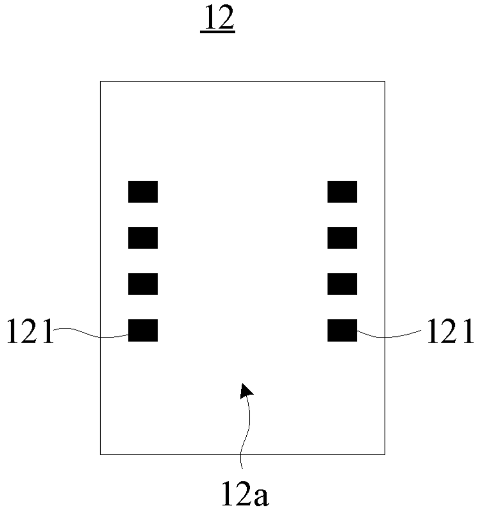
FIG. 5 is a schematic plan view of a first active surface of a first chip as shown in FIG. 4.

In some other examples, referring to FIGS. 4 and 5, the plurality of first pads 121 are disposed adjacent to the edges of the first active surface 12*a* of the first chip 12, to shorten lengths of first wires 141 and reduce the risk of damage of the first wires 141. In an example, the plurality of first pads 121 are disposed in two rows, and are disposed adjacent to the two opposite edges of the first active surface 12*a* respectively.

In an example, the material of the first pads 121 includes a metal, including, but not limited to, at least one of gold, copper, aluminum, silver and tungsten.

Referring to FIG. 1, the first conductive assembly 14 connects the first chip 12 and the circuit substrate 11, so as to achieve the connection between the first chip 12 and the circuit substrate 11, thereby facilitating the connection of the first chip 12 with the external circuit through the circuit substrate 11.

Referring to FIG. 1, in some examples, the first conductive assembly 14 comprises first wires 141. One end of each of the first wires 141 is fixed on the first pad 121 of the first active surface 12*a*, and the other end of each of the first wires 141 is fixed on the first surface 11*a* of the circuit substrate 11.

In an example, one end of each of the first wires 141 is fixed on the first pad 121 of the first active surface 12*a*, and the other ends of the first wires 141 are fixed on the pins 111, such that the first wires 141 are connected with the solder balls 181, thus making the solder balls 181 be connected with the first chip 12.

In an example, one end of each of the plurality of first wires 141 is fixed on the first pad 121 of the first active surface 12*a* through soldering, and the plurality of first wires 141 extend to two opposite sides of the first chip 12 respectively, and the other ends of the plurality of first wires 141 are also fixed on the plurality of pins 111 through soldering, but the present application is not limited thereto.

In an example, the material of the first wires 141 includes a metal, including, but not limited to, at least one of gold, copper, aluminum, silver and tungsten.

Figure 6:
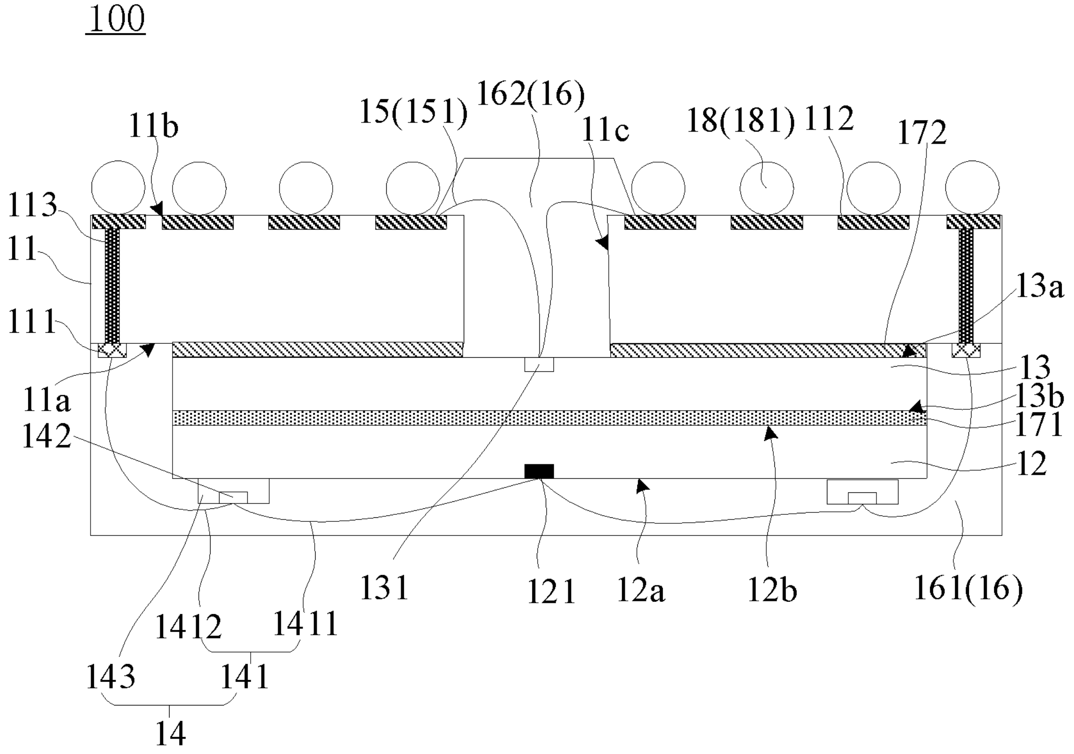
FIG. 6 is a schematic sectional view of a chip package device of some other examples of the present application.
Figure 7:
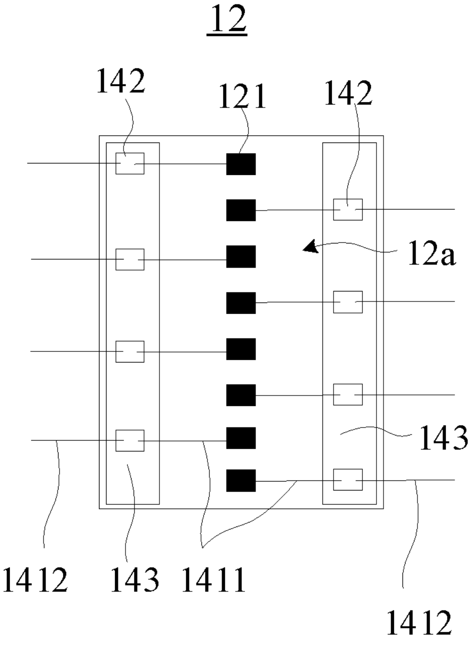
FIG. 7 is a schematic plan view of a first active surface of a first chip as shown in FIG. 6.
Figure 8:
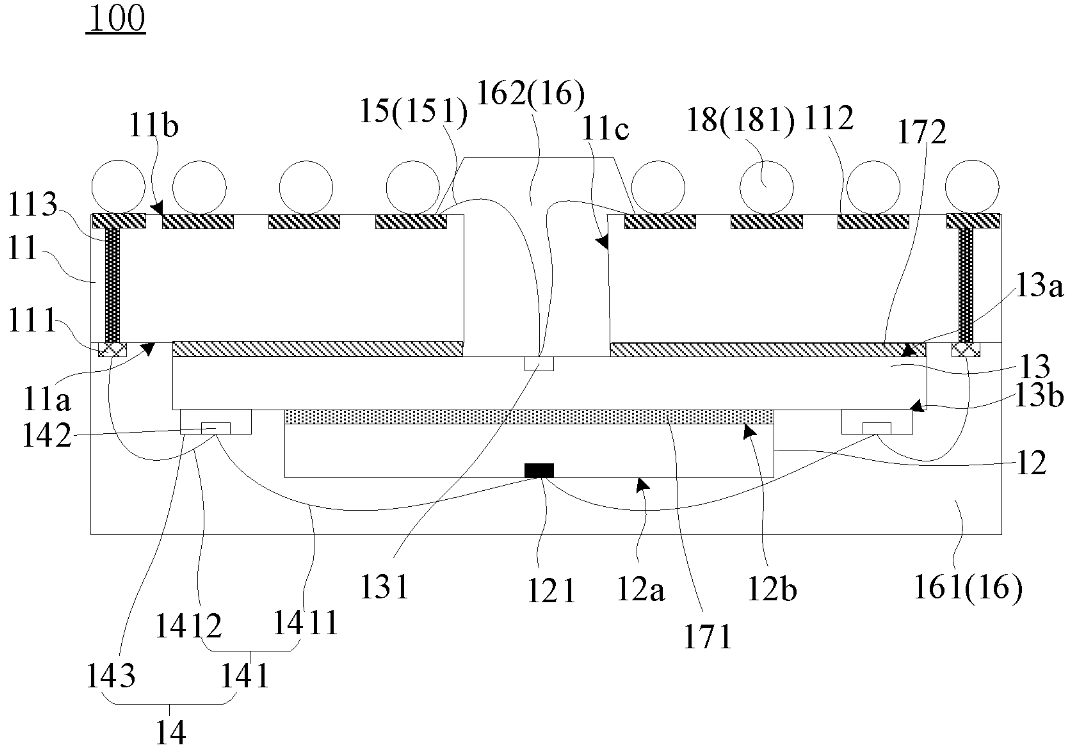
FIG. 8 is a schematic sectional view of a chip package device of some further examples of the present application.

Referring to FIGS. 6, 7 and 8, the first conductive assembly 14 further comprises conductive bridging blocks 142 that are fixed on at least one of the first chip 12 and the second chip 13. The first wires 141 comprise first wire segments 1411 and second wire segments 1412. The first wire segments 1411 are fixed on the conductive bridging blocks 142 and the first pad 121 of the first active surface 12*a* at two opposite ends respectively. The second wire segments 1412 are fixed on the conductive bridging blocks 142 and the pins 111 of the first surface 11*a* of the circuit substrate 11 at two opposite ends respectively.

Since the first wires 141 are divided into the first wire segments 1411 and the second wire segments 1412 that are connected through the conductive bridging blocks 142, the lengths of the first wire segments 1411 and the second wire segments 1412 are shorter while ensuring that the first wires 141 are connected to the circuit substrate 11 and the first pad 121, which improves the problem of control difficulty due to the long lengths of the first wires 141, and also reduces the process difficulty of the first wires 141 for connecting the circuit substrate 11 and the first pad 121 as well as reducing the risk of damaging the first wires 141.

It is to be noted that, the first wires 141 may also comprise more than two wire segments to further shorten the lengths of the wire segments of the first wires, thus further reducing the risk of damaging the first wires 141.

In some other examples, the lengths of the first wire segments 1411 and the second wire segments 1412 are equal, which is favorable to fabricate the first wire segments 1411 and the second wire segments 1412 through the same process, and simplify the fabrication process of the first wire segments 1411 and the second wire segments 1412.

In some further examples, the lengths of the first wire segments 1411 and the second wire segments 1412 may also be different. For example, the lengths of the second wire segments 1412 are greater than the lengths of the first wire segments 1411, to reduce the risk of damaging the second wire segments 1412 caused by a too large sum of thicknesses of the first chip 12 and the second chip 13.

In some other examples, the materials of the first wire segments 1411 and the second wire segments 1412 are the same, but the present application is not limited thereto.

Referring to FIGS. 6 and 7, in some other examples, the conductive bridging blocks 142 are fixed on the first active surface 12*a* of the first chip 12, and disposed as being spaced apart from the first pad 121.

In some other examples, the plurality of conductive bridging blocks 142 are disposed along the edges of the first active surface 12*a* of the first chip 12 to reduce the influence of the positions designed for the conductive bridging blocks 142 on the first chip 12.

In an example, the plurality of conductive bridging blocks 142 are disposed along two opposite edges of the first active surface 12*a* of the first chip 12.

In some further examples, referring to FIG. 8, in the case where the area of the first chip 12 is smaller than the area of the second chip 13, the conductive bridging blocks 142 may be also fixed on the surface of the second chip 13 far away from the circuit substrate 11 and disposed as being spaced apart from the first chip 12, which improves the problem of control difficulty due to too long lengths of the second wire segments 1412 caused by a too large sum of the thicknesses of the first chip 12 and the second chip 13.

In an example, the plurality of conductive bridging blocks 142 are disposed along the edges of the second back surface 13*b* of the second chip 13 respectively.

In some further examples, the plurality of conductive bridging blocks 142 may be also disposed along the edges of the second back surface 13*b* of the second chip 13 and the edges of the first active surface 12*a* of the first chip 12 respectively, which further improves the problem of control difficulty due to too lengths of the second wire segments 1412 caused by a too large sum of the thicknesses of the first chip 12 and the second chip 13.

In an example, the material of the conductive bridging blocks 142 includes a metal or a doped semiconductor material, wherein the metal includes, but is not limited to, at least one of gold, copper, aluminum, silver and tungsten, and the material of the semiconductor material includes, but is not limited to, silicon.

Referring to FIGS. 6, 7 and 8, the first conductive assembly 14 further comprises carriers 143 that are fixed on at least one of the first chip 12 and the second chip 13. The plurality of conductive bridging blocks 142 are located on the carriers 143, so as to directly fix the carriers 143 on at least one of the first chip 12 and the second chip 13 after fabricating the plurality of conductive bridging blocks 142 on the carriers 143, thereby simplifying the packaging process of the chip package device 100.

Referring to FIGS. 6 and 8, the plurality of conductive bridging blocks 142 are embedded into the surfaces of the carriers 143.

In some other examples, the plurality of conductive bridging blocks 142 may be also disposed on the surfaces of the carriers 143. In some further examples, the plurality of conductive bridging blocks 142 may be also integrated with the carriers 143.

Referring to FIGS. 6, 7 and 8, the carriers 143 are fixed on at least one of the first active surface 12*a* of the first chip 12 and the second back surface 13*b* of the second chip 13.

In an example, referring to FIG. 6, the carriers 143 are disposed along two opposite edges of the first active surface 12*a* of the first chip 12.

In an example, referring to FIG. 8, the carriers 143 are disposed along two opposite edges of the second back surface 13*b* of the second chip 13.

In an example, the carriers 143 include at least one of a semiconductor substrate and a circuit board. The semiconductor substrate includes, but is not limited to, a silicon substrate. The circuit board includes, but is not limited to, a printed circuit board. In an example, the carriers include printed circuit boards.

Referring to FIGS. 1, 4, 6 and 8, the chip package device 100 further comprises a first adhesion layer 171 and a second adhesion layer 172. The first adhesion layer 171 is disposed between the first chip 12 and the second chip 13, and adheres the first chip 12 and the second chip 13. The second adhesion layer 172 is disposed between the second chip 13 and the circuit substrate 11, and adheres the second chip 13 and the circuit substrate 11.

In some examples, the materials of the first adhesion layer 171 and the second adhesion layer 172 are different, but the present application is not limited thereto.

In an example, the material of the first adhesion layer 171 includes, but is not limited to, a double-sided tape, and the material of the second adhesion layer 172 includes, but is not limited to, B-Stage Epoxy.

Referring to FIGS. 1, 4, 6 and 8, the chip package device 100 further comprises a package layer 16 that is used to achieve packaging of the first chip 12 and the second chip 13, so as to prevent the first chip 12 and the second chip 13 from contacting with an external environment, prevent physical damage and corrosion, and improve the reliability of the performance of the chip package device 100.

In some examples, the package layer 16 at least partially covers the first conductive assembly 14, the first chip 12, the second chip 13 and the circuit substrate 11.

In an example, the package layer 16 comprises a first package layer 161 and a second package layer 162. The first package layer 161 covers the first conductive assembly 14, the first chip 12, the second chip 13 and the circuit substrate 11. The second package layer 162 is filled in the opening 11*c*, the second conductive assembly 15 is embedded in the second package layer 162, and the second package layer 162 further covers part of the circuit substrate 11.

In an example, the material of the package layer 16 includes, but is not limited to, an epoxy molding compound, an organosilicon material, a polyimide material and a ceramic material, etc.

Figure 9:
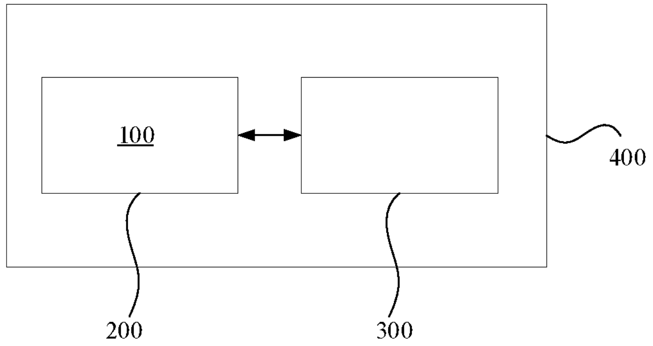
FIG. 9 is a block diagram of a memory system of some examples of the present application.
Figure 10:
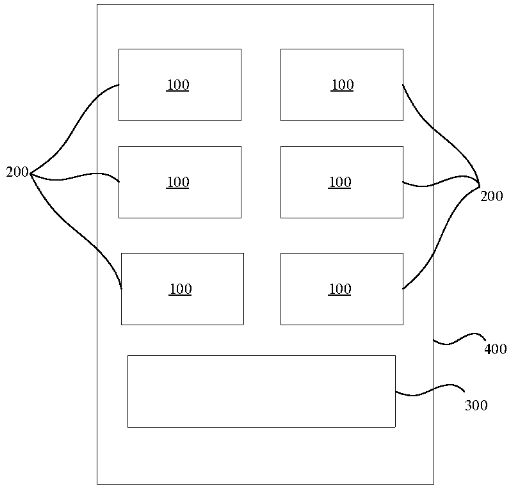
FIG. 10 is a block diagram of a memory system of some other examples of the present application.

Referring to FIGS. 9 and 10, some examples of the present application further provide a memory system 400 which comprises the chip package device 100 of any of the examples above.

The memory system 400 may be applied to and packaged into various types of electronic products, for example, a mobile phone (e.g. a cellphone), a desktop computer, a tablet computer, a notebook computer, a server, a vehicle apparatus, a gaming console, a printer, a positioning apparatus, a wearable apparatus, a smart sensor, a mobile power supply, a virtual reality (VR) apparatus, an augmented reality (AR) apparatus, or any other suitable electronic apparatuses having memories therein.

In some examples, as shown in FIGS. 9 and 10, in the case where the above-mentioned chip package device 100 comprises a memory chip but does not comprise a controller, the memory system 400 comprises a memory 200 and a controller 300, wherein the controller 300 is connected with the memory 200 and used to control the memory 200 to store data. The memory 200 comprises the chip package device 100 of any of the examples above.

In some other examples, in the case where the above-mentioned chip package device 100 comprises a memory chip and a controller, the memory system 400 comprises the above-mentioned chip package device 100.

In some examples, as shown in FIG. 9, the memory system 400 comprises one memory 200 and a controller 300. The memory system 400 may be integrated in a three-dimensional memory card.

The three-dimensional memory card includes any one of a PC (PCMCIA, Personal Computer Memory Card International Association) card, a Compact Flash (CF) card, a Smart Media (SM) card, a three-dimensional memory, a Multimedia Card (MMC), a Secure Digital Memory Card (SD) card, and a UFS.

In some other examples, referring to FIG. 10, the memory system 400 comprises a plurality of memories 200 and a controller 300. The memory system 400 is integrated into a solid state drive (SSD).

In some examples, in the memory system 400, the controller 300 is configured for operating in a low duty-cycle environment, such as Secure Digital (SD) cards, Compact Flash (CF) cards, Universal Serial Bus (USB) flash drives, or other media for use in electronic apparatuses, such as personal computers, digital cameras, mobile phones, etc.

In some other examples, in the memory system 400, the controller 300 is configured for operating in high duty-cycle environment like SSDs or eMMCs used as data memories for mobile apparatuses, such as smartphones, tablet computers, notebook computers, etc., and enterprise memory arrays.

In some examples, the controller 300 may be configured to manage the data stored in the memories 200 and communicate with an external apparatus (e.g., a host). In some examples, the controller 300 may be further configured to control operations of the memories 200, such as reading, erasing, and programming operations. In some examples, the controller 300 may be further configured to manage various functions with respect to data stored or to be stored in the memories 200, including at least one of bad-block management, garbage collection, logical-to-physical address conversion and wear leveling. In some examples, the controller 300 is further configured to process error correction codes with respect to the data read from or written to the memories 200.

Of course, the controller 300 may also perform any other suitable functions, such as formatting the memories 200. For example, the controller 300 may communicate with an external apparatus (e.g., a host) through at least one of various interface protocols.

It is to be noted that, the interface protocols include at least one of a USB protocol, an MMC protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol and a Firewire protocol.

Figure 11:
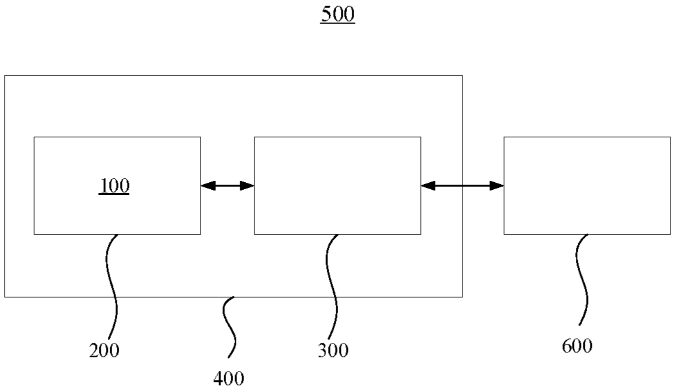
FIG. 11 is a block diagram of an electronic apparatus of some examples of the present application.

Referring to FIG. 11, some examples of the present application further describe an electronic apparatus 500. The electronic apparatus 500 may be any one of a cellphone, a desktop computer, a tablet computer, a notebook computer, a server, a vehicle apparatus, a wearable apparatus (e.g., a smart watch, a smart bracelet, smart glasses, etc.), a mobile power supply, a gaming machine, a digital multimedia player, etc.

The electronic apparatus 500 may comprise the above-mentioned memory system 400 and a host 600, wherein the host 600 comprises at least one of a central processing unit (CPU) and a cache, etc.

One purpose of the present application is to provide chip package devices and memory systems, to improve the performance of the chip package devices and the memory systems.

In a first aspect, the present application provides a chip package device which comprises: a circuit substrate having a first surface and a second surface disposed oppositely, wherein the circuit substrate comprises an opening that penetrates through the circuit substrate in a direction from the first surface towards the second surface; a first chip; a second chip, wherein the second chip is fixed on the first surface of the circuit substrate, and the first chip is fixed on a surface of the second chip far away from the circuit substrate; a first conductive assembly connecting the first chip and the circuit substrate; and a second conductive assembly, wherein a part of the second conductive assembly penetrates through the opening, and the second conductive assembly connects the second chip and the circuit substrate.

In some examples, the first chip has a first active surface and a first back surface disposed oppositely, the first back surface of the first chip is fixed on the second chip, and a first pad is disposed on the first active surface.

In some examples, the first conductive assembly comprises: first wires, one end of each of the first wires being fixed on the first pad of the first active surface, and the other end of each of the first wires being fixed on the first surface of the circuit substrate.

In some examples, the first conductive assembly further comprises: conductive bridging blocks fixed on at least one of the first chip and the second chip, wherein the first wires comprise first wire segments and second wire segments, two opposite ends of the first wire segments being fixed on the conductive bridging blocks and the first pad of the first active surface respectively, and two opposite ends of the second wire segments being fixed on the conductive bridging blocks and the first surface of the circuit substrate respectively.

In some examples, the conductive bridging blocks are fixed on the first active surface of the first chip, and are disposed as being spaced apart from the first pad.

In some examples, the conductive bridging blocks are fixed on the surface of the second chip far away from the circuit substrate, and are disposed as being spaced apart from the first chip.

In some examples, the first conductive assembly further comprises: carriers, wherein the carriers are fixed on at least one of the first chip and the second chip, and a plurality of the conductive bridging blocks are located on the carriers.

In some examples, the carriers include at least one of a semiconductor substrate and a circuit board.

In some examples, the circuit substrate further comprises: pins located on the first surface of the circuit substrate, disposed as being spaced apart from the second chip, and connected with the circuit substrate, wherein the other ends of the first wires are fixed on the pins.

In some examples, the second chip has a second active surface and a second back surface disposed oppositely, the second active surface of the second chip is fixed on the first surface of the circuit substrate, and a plurality of second pads are disposed on the second active surface and are exposed in the opening; the second conductive assembly comprises second wires that penetrate through the opening, and two opposite ends of the second wires are fixed on the second pads and the second surface of the circuit substrate respectively.

In some examples, the plurality of second pads are located between two opposite edges of the second chip.

In some examples, the chip package device further comprises: a first adhesion layer that is disposed between the first chip and the second chip, and adheres the first chip and the second chip.

In some examples, the chip package device further comprises: a second adhesion layer that is disposed between the second chip and the circuit substrate, and adheres the second chip and the circuit substrate.

In some examples, the circuit substrate comprises a plurality of third pads located on the second surface; and the chip package device further comprises: a ball grid array comprising a plurality of solder balls located on the plurality of third pads.

In some examples, the chip package device further comprises: a package layer at least partially covering the first conductive assembly, the first chip, the second chip and the circuit substrate.

In a second aspect, the present application further provides a memory system comprising the chip package device of any one of the above examples.

In some examples of the present application, the second chip is fixed on the first surface of the circuit substrate, the first chip is fixed on the surface of the second chip far away from the circuit substrate, the first conductive assembly connects the first chip and the circuit substrate, a part of the second conductive assembly penetrates through the opening of the circuit substrate, and the second conductive assembly connects the second chip and the circuit substrate, so that the chip package device comprises the first chip and the second chip stacked together, and both the first chip and the second chip are connected with the circuit substrate, thus achieving the packaging of two chips, which is beneficial to improving the performance of the chip package device while increasing the storage capacity, can be suitable for specific pin position requirements, and can lower the cost of manufacturing the chip package device.

The descriptions of some examples above are only used to help understand technical solutions and core ideas of the present application. Those of ordinary skill in the art should understand that they may still modify the technical solutions as set forth in various aforementioned examples, or equivalently substitute part of the technical features. However, these modifications or substitutions do not make the essence of the respective technical solutions depart from the scope of the technical solutions of various examples of the present application.

What is claimed is:

1. A chip package device, comprising:

a circuit substrate having a first surface and a second surface disposed oppositely, wherein the circuit substrate comprises an opening that penetrates through the circuit substrate in a direction from the first surface towards the second surface;

a first chip;

a second chip, wherein the second chip is fixed on the first surface of the circuit substrate, and the first chip is fixed on a surface of the second chip away from the circuit substrate;

a first conductive assembly connecting the first chip and the circuit substrate; and a second conductive assembly, wherein a part of the second conductive assembly penetrates through the opening from the first surface to the second surface of the circuit substrate, and the second conductive assembly connects the second chip and the circuit substrate.

2. The chip package device of claim 1, wherein the first chip has a first active surface and a first back surface disposed oppositely, the first back surface of the first chip is fixed on the second chip, and a first pad is disposed on the first active surface.

3. The chip package device of claim 2, wherein the first conductive assembly comprises:

first wires, one end of each of the first wires being fixed on the first pad of the first active surface, and other ends of each of the first wires being fixed on the first surface of the circuit substrate.

4. The chip package device of claim 3, wherein the first conductive assembly further comprises:

conductive bridging blocks fixed on at least one of the first chip and the second chip;

and the first wires comprise first wire segments and second wire segments, two opposite ends of the first wire segments being fixed on the conductive bridging blocks and the first pad of the first active surface respectively, and two opposite ends of the second wire segments being fixed on the conductive bridging blocks and the first surface of the circuit substrate respectively.

5. The chip package device of claim 4, wherein the conductive bridging blocks are fixed on the first active surface of the first chip, and are disposed as being spaced apart from the first pad.

6. The chip package device of claim 4, wherein the conductive bridging blocks are fixed on the surface of the second chip far away from the circuit substrate, and are disposed as being spaced apart from the first chip.

7. The chip package device of claim 4, wherein the first conductive assembly further comprises:

carriers, wherein the carriers are fixed on at least one of the first chip and the second chip, and a plurality of the conductive bridging blocks are located on the carriers.

8. The chip package device of claim 7, wherein the carriers include at least one of a semiconductor substrate and a circuit board.

9. The chip package device of claim 3, wherein the circuit substrate further comprises:

pins located on the first surface of the circuit substrate, disposed as being spaced apart from the second chip, and connected with the circuit substrate, wherein other ends of the first wires are fixed on the pins.

10. The chip package device of claim 3, wherein the second chip has a second active surface and a second back surface disposed oppositely, the second active surface of the second chip is fixed on the first surface of the circuit substrate, and a plurality of second pads are disposed on the second active surface and are exposed in the opening; and the second conductive assembly comprises second wires that penetrate through the opening, and two opposite ends of the second wires are fixed on the second pads and the second surface of the circuit substrate respectively.

11. The chip package device of claim 10, wherein the plurality of second pads are located between two opposite edges of the second chip.

12. The chip package device of claim 1, further comprising:

a first adhesion layer that is disposed between the first chip and the second chip, and adheres the first chip and the second chip.

13. The chip package device of claim 1, further comprising:

a second adhesion layer that is disposed between the second chip and the circuit substrate, and adheres the second chip and the circuit substrate.

14. The chip package device of claim 1, wherein the circuit substrate comprises a plurality of third pads located on the second surface;

and the chip package device further comprises:

a ball grid array comprising a plurality of solder balls located on the plurality of third pads.

15. The chip package device of claim 1, further comprising:

a package layer at least partially covering the first conductive assembly, the first chip, the second chip and the circuit substrate.

16. A memory system, comprising:

a chip package device comprising:

a circuit substrate having a first surface and a second surface disposed oppositely, wherein the circuit substrate comprises an opening that penetrates through the circuit substrate in a direction from the first surface towards the second surface;

a first chip;

a second chip, wherein the second chip is fixed on the first surface of the circuit substrate, and the first chip is fixed on a surface of the second chip far away from the circuit substrate;

a first conductive assembly connecting the first chip and the circuit substrate; and a second conductive assembly, wherein a part of the second conductive assembly penetrates through the opening from the first surface to the second surface of the circuit substrate, and the second conductive assembly connects the second chip and the circuit substrate.

* * * * *